(12) United States Patent
Andrieu et al.

(10) Patent No.: US 10,741,565 B2
(45) Date of Patent: Aug. 11, 2020

(54) 3D SRAM CIRCUIT WITH DOUBLE GATE TRANSISTORS WITH IMPROVED LAYOUT

(71) Applicants: COMMISSARIAT A L'ENERGIE ATOMIQUE ET AUX ENERGIES ALTERNATIVES, Paris (FR); STMicroelectronics (Crolles 2) SAS, Crolles (FR)

(72) Inventors: Francois Andrieu, Grenoble (FR); Remy Berthelon, Grenoble (FR); Bastien Giraud, Grenoble (FR)

(73) Assignees: COMMISSARIAT A L'ENERGIE ATOMIQUE ET AUX ENERGIES ALTERNATIVES, Paris (FR); STMicroelectronics (Crolles 2) SAS, Crolles (FR)

( * ) Notice: Subject to any disclaimer, the term of this patent is extended or adjusted under 35 U.S.C. 154(b) by 0 days.

(21) Appl. No.: 16/379,476

(22) Filed: Apr. 9, 2019

(65) Prior Publication Data
US 2019/0312039 A1    Oct. 10, 2019

(30) Foreign Application Priority Data
Apr. 10, 2018 (FR) ...................... 18 53115

(51) Int. Cl.
*G11C 11/41* (2006.01)
*H01L 27/11* (2006.01)
(Continued)

(52) U.S. Cl.
CPC ........ *H01L 27/1104* (2013.01); *G11C 11/419* (2013.01); *H01L 21/8221* (2013.01); *H01L 27/0688* (2013.01); *H01L 27/1203* (2013.01)

(58) Field of Classification Search
None
See application file for complete search history.

(56) References Cited

U.S. PATENT DOCUMENTS

| | | | |
|---|---|---|---|
| 6,643,159 B2 * | 11/2003 | Fricke | G11C 5/025 257/E21.614 |
| 8,964,452 B2 * | 2/2015 | Su | G11C 11/419 365/154 |

(Continued)

FOREIGN PATENT DOCUMENTS

EP    2 131 396 A1    12/2009

OTHER PUBLICATIONS

French Preliminary Search Report dated Dec. 20, 2018 in French Application 18 53115 filed on Apr. 10, 2018 (with English Translation of Categories of Cited Documents).

(Continued)

*Primary Examiner* — Douglas King
(74) *Attorney, Agent, or Firm* — Oblon, McClelland, Maier & Neustadt, L.L.P.

(57) ABSTRACT

The application relates to an integrated circuit with SRAM memory and provided with several superimposed levels of transistors, the integrated circuit including SRAM cells provided with a first transistor and a second transistor belonging to an upper level of transistors and each having a double gate composed of an upper electrode and a lower electrode laid out on either side of a semiconductor layer, a lower gate electrode of the first transistor being connected to a lower gate electrode of the second transistor.

18 Claims, 12 Drawing Sheets

(51) Int. Cl.
*G11C 11/419* (2006.01)
*H01L 21/822* (2006.01)
*H01L 27/06* (2006.01)
*H01L 27/12* (2006.01)

(56) References Cited

U.S. PATENT DOCUMENTS

| | | |
|---|---|---|
| 9,875,789 B2 * | 1/2018 | Chen ................... G11C 11/418 |
| 2007/0183185 A1 | 8/2007 | Guo et al. |
| 2008/0175039 A1 | 7/2008 | Thomas et al. |
| 2009/0294861 A1 | 12/2009 | Thomas et al. |
| 2010/0328990 A1 | 12/2010 | Ouchi et al. |
| 2011/0242881 A1 | 10/2011 | Ouchi |
| 2012/0113708 A1 | 5/2012 | Jung et al. |
| 2013/0148402 A1 * | 6/2013 | Chang ..................... G11C 8/08 |
| | | 365/63 |

OTHER PUBLICATIONS

U.S. Appl. No. 16/196,390, filed Nov. 20, 2018, Francois Andrieu, et al.
U.S. Appl. No. 16/221,939, filed Dec. 17, 2018, Francois Andrieu, et al.

* cited by examiner

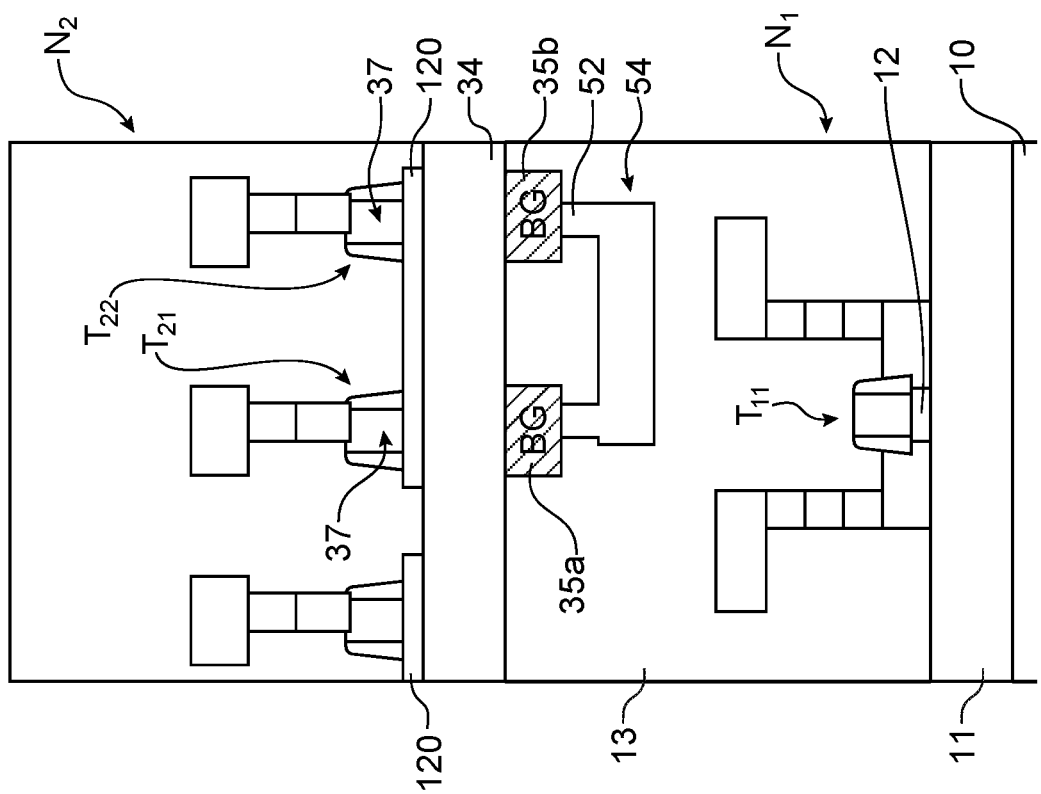
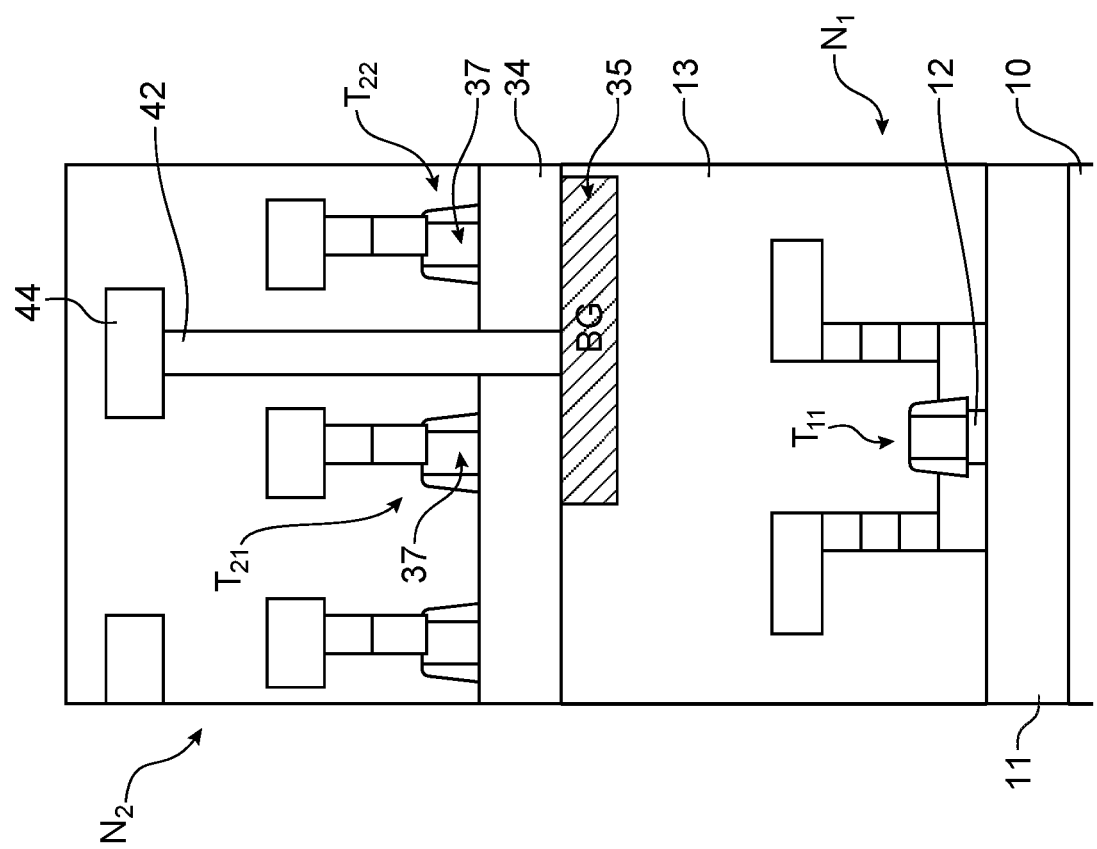

3D SRAM CIRCUIT WITH DOUBLE GATE TRANSISTORS WITH IMPROVED LAYOUT

TECHNICAL FIELD AND PRIOR ART

The present invention pertains to the field of SRAM (Static Random Access Memory) type memories, and more specifically relates to that of integrated circuits with transistors distributed over several levels and provided with a SRAM memory device.

Generally speaking, in the microelectronics field, it is continuously sought to increase the density of transistors.

To do so, one solution consists in distributing the transistors over several levels of semiconductor layers arranged one on top of the other.

Such devices thus generally comprise a lower level provided with a first semiconductor layer from which transistors are formed and at least one upper level provided with at least one second semiconductor layer from which transistors are formed, the first and the second semiconductor layers being superimposed and separated from each other by at least one insulator layer.

It is sought to produce a novel SRAM memory device having improved electrical performances while limiting the size thereof.

DESCRIPTION OF THE INVENTION

According to an embodiment, an integrated circuit with SRAM memory provided with several superimposed levels of electronic components is proposed including:

a lower level provided with one or more electronic components, formed in and on at least one first semiconductor layer, an upper level including transistors having respective channel regions formed in at least one second semiconductor layer arranged above the first semiconductor layer, the integrated circuit including a memory device formed of a plurality of SRAM memory cells, the memory device including a first transistor and a second transistor belonging to said upper level and each having a double gate composed of an upper electrode formed on the second semiconductor layer and a lower electrode laid out between the second semiconductor layer and the first semiconductor layer, the lower gate electrode of the first transistor being connected or coupled to the lower gate electrode of the second transistor, the lower gate electrode of the first transistor and the lower gate electrode of the second transistor being connected or coupled to a conductive polarisation, or biasing, line.

Such a layout of lower gate electrodes makes it possible to improve the electrical performances of the memory device while limiting the size thereof.

The lower gate electrode of the first transistor is connected to the lower gate electrode of the second transistor. The term "connected" here designates an electrical connection formed by one or more conductive lines and/or one or more conductive vias directly connecting the lower gate electrodes to each other, the term directly signifying without intermediate electronic component. The term "connected" such as used in the above characteristic also applies to define the lower gate electrodes formed by a single, or a unique, conductive portion.

The conductive polarisation line may comprise at least one conductive portion of an interconnections level located between the lower and upper levels, or above the upper level such that the upper level is located between said interconnections level and the lower level. The conductive polarisation line may correspond to a single, or a unique, electrically conductive portion of such an interconnections level.

The integrated circuit may comprise a control circuit configured to apply signals or potentials to the different lines of the integrated circuit during the operation of the integrated circuit.

The lower gate electrodes of the first and second transistors may be distinct from the electronic components formed in and on the first semiconductor layer, and notably distinct from upper gates of transistors formed in and on the first semiconductor layer.

The SRAM memory device may be arranged uniquely in the upper level.

The lower gate electrodes may be connected to the conductive polarisation line through conductive vias.

The electronic components of the lower level may be transistors or another type of electronic component.

According to one possible configuration of the circuit, the lower electrodes form a common lower gate electrode coupled or connected to the conductive polarisation line arranged above the first and the second transistor by means of at least one conductive via.

Advantageously, according to another configuration, the lower gate electrodes are distinct and coupled or connected to said conductive polarisation line, in particular through conductive vias. This can make it possible to further reduce the interconnection density in the upper stage, which already typically comprises a high density of interconnections.

The first transistor and the second transistor may be transistors of distinct SRAM cells of a same memory plane, and in particular transistors of different cells of a same line (horizontal row) or of a same column (vertical row) of cells.

In an alternative, the first transistor and the second transistor may be transistors of a same SRAM cell.

A particular embodiment of this alternative provides that the first transistor and the second transistor are access transistors of a same SRAM cell.

In this case, the upper gate electrode of the first transistor and the upper gate electrode of the second transistor may be connected or coupled to a same word line. The conductive polarisation line may then be a supplementary conductive polarisation line distinct from said word line.

This supplementary conductive polarisation line may in particular be provided to make it possible to improve the performances during reading and/or writing accesses of the SRAM cell.

A SRAM cell is typically further formed of other transistors, in particular load transistors and conduction transistors, forming inverters of a flip-flop. Advantageously, the load and conduction transistors may also each be provided with a double gate composed of a so-called "upper gate" or "front gate" electrode laid out on the second semiconductor layer and another so-called "lower gate" or "rear gate" electrode laid out between the second semiconductor layer and the first semiconductor layer.

A particular embodiment provides that the supplementary conductive polarisation line fulfils a function of write assist line. Thus, in this case, it is typically provided to apply to this supplementary conductive polarisation line a given potential during writing operations carried out on the cell and a potential different from said given potential during reading operations carried out on said SRAM cell as well as when the SRAM cell is in retention phase of the stored logic information.

The load transistors may also have a lower gate electrode coupled or connected to the conductive polarisation line, in particular when said line fulfils the write assist function.

Another particular embodiment provides that the supplementary conductive polarisation line fulfils a function of access assist line of a SRAM cell. In this case, it is typically provided to apply to this supplementary conductive polarisation line a given potential during writing and/or reading operations carried out on said SRAM cell and a potential different from said given potential when said SRAM cell is in retention phase of the stored logic information.

Another particular embodiment provides that the supplementary conductive polarisation line fulfils a write assist function and is coupled or connected to the lower gate electrode of each of the load transistors. Thus, in this case, it is typically provided to apply to this supplementary conductive polarisation line a given potential during writing operations on said SRAM cell and a potential different from said given potential during reading operations carried out on said SRAM cell and/or during retention phases of said SRAM cell.

Another particular embodiment provides that the conduction transistors have a lower gate electrode coupled or connected to the supplementary conductive polarisation line. In this case, advantageously, the load transistors have a lower gate electrode coupled or connected to an additional conductive polarisation line.

According to another particular embodiment in which the first transistor and the second transistor are respectively a first access transistor coupled or connected to a first storage node of a SRAM cell and a second access transistor coupled or connected to a second storage node of this SRAM cell, the SRAM cell may also be provided with a first load transistor and a second load transistor each having a double gate, a lower gate electrode of the second load transistor and the first access transistor being coupled or connected to a first bit line, a lower gate electrode of the first load transistor and the second access transistor being coupled or connected to a second bit line.

The SRAM cell may also be provided with a first conduction transistor and a second conduction transistor each having a double gate, the lower gate electrode of the second conduction transistor being coupled or connected to the first bit line, the lower gate electrode of the first conduction transistor being coupled or connected to a second bit line.

According to another particular embodiment in which the first transistor and the second transistor are conduction transistors of a same SRAM cell, the conductive polarisation line may fulfil a read assist function. Thus, in this case, it is typically provided to apply a given potential during reading operations carried out on said SRAM cell and a potential different from said given potential during writing operations carried out on said SRAM cell or when the cell is in an information retention phase.

According to another particular embodiment in which the first transistor and the second transistor are load transistors of a same SRAM cell, the conductive polarisation line may fulfil a write assist function. Thus, in this case, it is typically provided to apply a given potential during writing operations and retention phase and a potential different from said given potential during reading operations carried out on said same SRAM cell.

In an alternative, the conductive polarisation line may be a word line to which the upper gate electrode and the lower gate electrode of each of the access transistors is coupled or connected as well as the lower gate electrode of each of the load transistors.

According to another aspect, an embodiment of the integrated circuit in which the first transistor and the second transistor are conduction or load transistors, respectively of a first memory cell and of a second memory cell of a same row of memory cells, said conductive polarisation line may be a first bit line.

In this case, a complementary bit line may be connected or coupled to a lower gate electrode of another conduction or load transistor of the first cell. This complementary bit line may also be connected or coupled to another lower gate electrode of another load or conduction transistor of another cell of the same row as the first cell.

BRIEF DESCRIPTION OF THE DRAWINGS

The present invention will be better understood on reading the description of exemplary embodiments given for purely indicative purposes and in no way limiting, while referring to the appended drawings in which.

The different parts shown in the figures are not necessarily according to a uniform scale, in order to make the figures more legible.

DETAILED DESCRIPTION OF PARTICULAR EMBODIMENTS

Figure 1:
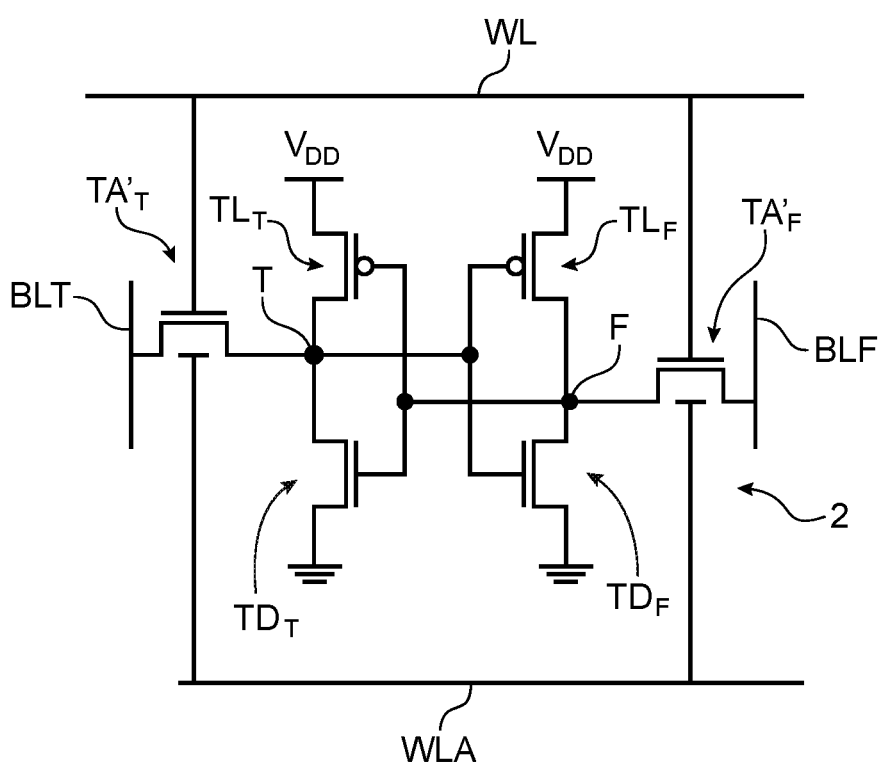
FIG. 1 serves to illustrate an example of set up of a 6T static random access memory cell integrated in a 3D circuit, with access transistors provided with a supplementary gate electrode connected to a supplementary conductive write assist line, FIG. 2A serves to illustrate an example of configuration of rear gate electrode common to the upper level transistors of a circuit provided with several superimposed levels of transistors, the rear gate electrode being connected to a supplementary conductive polarisation line.

An exemplary layout of a SRAM memory cell 2 capable of being integrated in a circuit such as implemented in accordance with an embodiment is illustrated in FIG. 1.

The cell 2 shown in FIG. 1 is provided with two storage nodes T and F, provided to conserve a first logic information, and a complementary logic information of the first information. The maintaining of the logic information in the nodes T, F is ensured by transistors forming inverters looped on themselves.

In this example, the cell 2 is of type commonly known as "6T" and thereby formed of 6 transistors, the two inverters being typically formed by two load transistors $TL_T$ and $TL_F$, in this example PMOS transistors commonly known as "pull-up" and two conduction transistors $TD_T$ and $TD_F$ in this example NMOS type transistors and typically known as "pull down". The inverters are supplied by a supply potential VDD.

Access to the storage nodes T and F is achieved by means of two access transistors $TA'_T$ and $TA'_F$ respectively connected to so-called bit lines $BL_T$ and $BL_F$ generally shared by the SRAM cells of a same column of cells of a matrix of cells similar to that illustrated.

Access to the storage nodes T and F is controlled by a word line WL generally shared by the SRAM cells of a same line of cells of the matrix. The access transistors $TA'_T$ and $TA'_F$ are thereby provided to enable access or to block access respectively to the first node T and to the second node F.

The cell 2 comprises double gate transistors that are integrated in an upper level of the integrated circuit provided with several superimposed levels of transistors, the double gate being formed of an upper gate electrode also known as "front gate" and of a lower gate electrode also known as "rear gate" distributed on either side of a semiconductor layer in which the channel regions of these double gate transistors are provided.

In the particular exemplary embodiment illustrated in FIG. 1, it is the access transistors $TA'_T$, $TA'_F$ that are provided with a double gate. A gate electrode of the first access transistor $TA'_T$ and a gate electrode of the second access transistor $TA'_F$ are also connected to each other and to a same word line WL.

A lower gate electrode of the first access transistor $TA'_T$ and a lower gate electrode of the second access transistor $TA'_F$ are connected to each other and to a same conductive zone. This conductive zone is in the form of a conductive line or connected to a conductive polarisation line. In the particular example illustrated in FIG. 1, the conductive line is a supplementary polarisation line fulfilling a so-called "write assist" WLA function. This write assist line WLA is typically activated uniquely during writing operations carried out on the cell 2. Thus, an activation signal is applied to this line WLA during writing operations carried out on the cell 2 whereas during reading operations no signal or a different signal is applied to this line WLA. The concomitant activation of the word line WL and the write assist line WLA during writing operations makes it possible to make the access transistors $TA'_T$, $TA'_F$ more conductive than they are during reading operations for which only the word line WL is activated.

A cell 2 such as that illustrated in FIG. 1 has an improved writing margin and writing current compared to a 6T cell of conventional layout and without write assist line. For example, for a potential of the order of 1V applied to the write assist line WLA, it is possible to increase the writing current of the order of 35%.

A particular embodiment provides connecting the lower gate electrode of each of the access transistors $TA'_T$ and $TA'_F$ to the supplementary polarisation line, here write assist line WLA.

To do so, the access transistors $TA'_T$ and $TA'_F$ may have a layout for example such as that of the transistors $T_{21}$, $T_{22}$ illustrated in FIG. 2A or such as that illustrated in FIG. 2B.

The device illustrated in these figures is formed from a substrate including a first level $N_1$ provided with at least one first superficial semiconductor layer 12 in which channel regions of transistors of the first level $N_1$ are provided. The substrate may be of semiconductor on insulator type, in particular a substrate of SOI (Silicon On Insulator) type advantageously according to a FDSOI (Fully Depleted Silicon On Insulator) technology. In this case, the first superficial semiconductor layer 12 is arranged on an insulator layer 11 commonly called BOX (Buried Oxide), itself lying on a semiconductor support layer 10.

In the example illustrated, a transistor $T_{11}$ of the first level $N_1$ is covered with at least one insulator layer 13, for example made of silicon oxide.

The circuit is provided with at least one second level $N_2$ of one or more transistors arranged on the first level $N_1$ and of which the respective channel regions extend in at least one second semiconductor layer 120 (not visible in the sectional view of FIG. 2A).

The second level $N_2$ comprises transistors $T_{21}$, $T_{22}$, with a double gate formed of an upper gate electrode 37 located on the second semiconductor layer and a lower electrode 35 located under the second semiconductor layer, in other words between the second semiconductor layer and the first semiconductor layer 12.

The lower gate electrode 35 is typically separated from the second semiconductor layer by a dielectric layer 34. This dielectric layer 34 has a composition and a thickness provided to enable an electrostatic coupling, also known as capacitive coupling, between the lower gate electrode 35 and the second semiconductor layer. Thus, the channel regions of the transistors $T_{21}$, $T_{22}$, are in this example also controlled from below, respectively through lower gate electrodes.

In the exemplary layout illustrated in FIG. 2A, the transistors $T_{21}$, $T_{22}$, with double gate share a common lower electrode 35 located under the semiconductor layer in which their channel regions are provided. The common lower electrode 35 may be connected to a conductive polarisation line 44 located on the second level $N_2$ of transistors. The connection between the lower electrode 35 and the conductive line 44 is typically implemented through a vertical or substantially vertical conductive element 42 that crosses the dielectric layer 34 and of type commonly known as "via".

The conductive line 44 may for example fulfil the function of write assist line WLA described previously in relation with FIG. 1. In this case, the activation signal of the line WLA is conveyed by the upper level $N_2$ above the transistors $T_{21}$, $T_{22}$ and may be applied under the transistors $T_{21}$, $T_{22}$ through the lower electrode 35.

In the alternative embodiment illustrated in FIG. 2B, the transistors $T_{21}$, $T_{22}$, with double gate have respective distinct lower electrodes 35a, 35b connected to each other through a structure provided with a conductive polarisation line 54 located under the second level $N_2$ of transistors, and in particular under the lower electrodes 35a, 35b. The conductive polarisation line 54 may for example fulfil the function of supplementary write assist line WLA mentioned previously or be connected to the supplementary write assist line WLA. The connection between the lower electrodes 35a, 35b and the conductive line 54 is typically implemented through vertical conductive elements 52 or "vias".

Figure 2C:
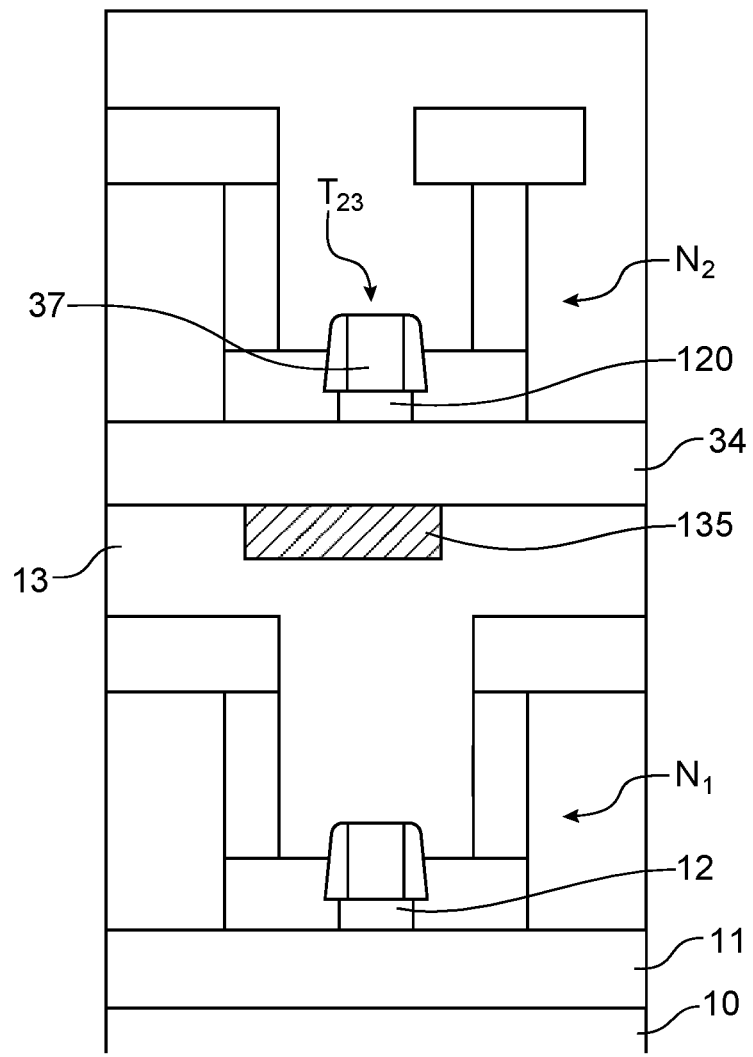
FIG. 2B illustrates another example of configuration of rear gate electrodes of upper level transistors of a circuit provided with several superimposed levels of transistors, the rear gate electrodes being connected to a supplementary conductive polarisation line, FIG. 2C serves to illustrate an example of configuration of gate electrodes of a double gate transistor in a 3D circuit, FIG. 3 gives a particular example of layout of the transistors of an upper level and belonging to SRAM cells implemented according to an embodiment, FIG. 4 serves to illustrate an example of set up of SRAM memory cell with double gate access and load transistors and having a gate electrode controlled by means of a same conductive line, FIG. 5 serves to illustrate another exemplary layout of the transistors of SRAM cells, FIG. 6 serves to illustrate an alternative layout of SRAM cell, FIG. 7 serves to illustrate an example of particular configuration of SRAM cell in which the access transistors are with double gate and provided with a gate electrode controlled by a conductive line activated during reading or writing accesses of the cell, FIG. 8 serves to illustrate an example of particular configuration of SRAM cell in which the conduction transistors are with double gate and provided with a gate electrode controlled by a conductive line activated during reading accesses of the cell, FIG. 9 serves to illustrate an example of particular configuration of SRAM cell in which the load transistors are with double gate and provided with a gate electrode controlled by a conductive line activated during writing accesses and when the cell is in retention phase, FIG. 10 serves to illustrate an example of particular configuration of SRAM cell in which the access and conduction transistors are with double gate and provided with a rear gate electrode controlled by a same conductive line, FIG. 11 serves to illustrate an alternative to the layout of FIG. 10 in which the load transistors are with double gate and have rear gate electrodes that are common or connected to each other, FIG. 12 serves to illustrate an example of particular configuration of SRAM cell in which the access and conduction transistors are with double gate and provided with rear gate electrodes that are common or connected to each other and controlled by a same conductive line, FIG. 13 serves to illustrate an example of particular configuration of SRAM cell in which the access and load transistors are with double gate and provided with rear gate electrodes that are common or connected to each other and controlled by a same word line, FIG. 14 serves to illustrate an example of particular configuration of SRAM cell with load transistors with double gate and provided with rear gate electrodes respectively connected to a first bit line and to a second bit line, FIG. 15 serves to illustrate an alternative of the layout of FIG. 14 in which the conduction transistors are also with double gate and provided with rear gate electrodes respectively connected to a first bit line and to a second bit line, Identical, similar or equivalent parts of the different figures bear the same numerical references so as to make it easier to go from one figure to the next.

A particular embodiment provides an SRAM cell in which the load and/or conduction transistors have a layout for example such as that of the transistor $T_{23}$ illustrated in FIG. 2C.

This transistor $T_{23}$ belongs to the second level $N_2$ and has a channel region that extends in the second semiconductor layer 120. The transistor $T_{23}$ comprises a double gate formed of an upper gate electrode 37 located on the second semiconductor layer 120 and a lower gate electrode 135 located between the second semiconductor layer 120 and the first semiconductor layer 12 of the first level $N_1$ of transistors. The first semiconductor layer 12 and the second semiconductor layer have a layout similar to that described previously in relation with FIGS. 2A-2B and are this time visible in the sectional view of FIG. 2C.

Figure 3:
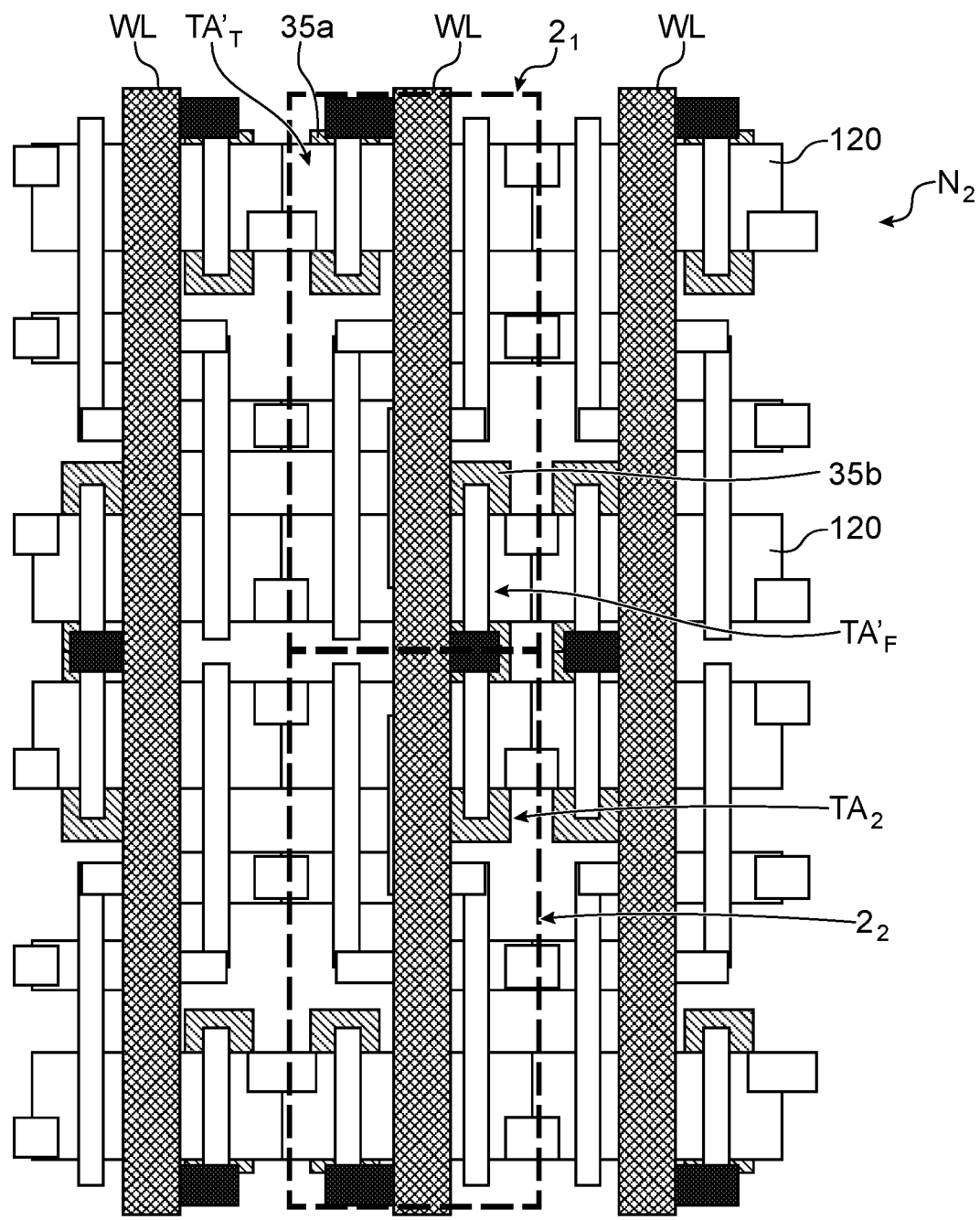

FIG. 3 gives an exemplary layout of the upper level $N_2$ of a 3D circuit provided with SRAM memory cells according to the configuration of FIG. 1 and provided with access transistors having a configuration of the type of that of FIG. 2B with lower electrodes 35a, 35b connected to a write assist line (not shown in this figure).

In this example, it is further provided that the transistors $TA'_F$, $TA_2$ of different cells $2_1$, $2_2$, but belonging to a same row (or line) of cells, have a common lower gate electrode 35b or lower gate electrodes connected to each other through a same conductive zone.

The example of FIG. 3 illustrates the case where an access transistor $TA'_F$ of a first cell and an access transistor $TA_2$ of a second cell, the first and the second cells belonging to the same row of cells, share the same lower gate electrode. However, it is to be noted that in this particular case, for a same cell, the two access transistors do not share the same lower gate electrode.

In a SRAM cell of an integrated circuit other transistors may also be provided with a double gate, and in particular certain transistors forming the inverters in other words the flip-flop of a SRAM cell.

Figure 4:
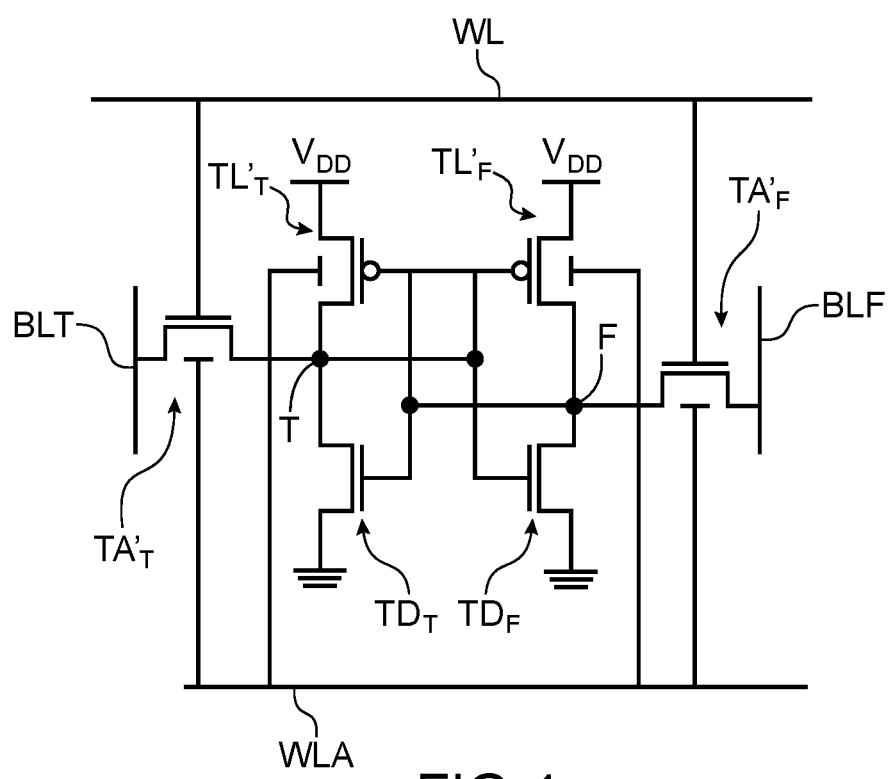

In the exemplary embodiment illustrated in FIG. 4, the SRAM cell differs from that described previously in relation with FIG. 1, in that it is this time provided with a load transistor $TL'_T$ and with another load transistor $TL'_F$ each having a supplementary gate electrode, corresponding to a lower gate electrode, connected to the write assist line WLA. This supplementary gate electrode may be a lower gate electrode 35 or 35a, or 35b of layout of the type of that described previously in relation with FIG. 2A or with FIG. 2B.

In such a configuration, during writing operations, whereas the conduction of the access transistors $TA'_T$, $TA'_F$, here of NMOS type, is increased, that of the load transistors $TL'_T$, $TL'_F$ generally of opposite type, in this example of PMOS type, is decreased.

Compared to a conventional 6T memory cell configuration without write assist line, this makes it possible to increase the writing margin and the writing current. This can also make it possible to increase the writing margin compared to a configuration of memory cell such as that illustrated in FIG. 1.

Figure 5:
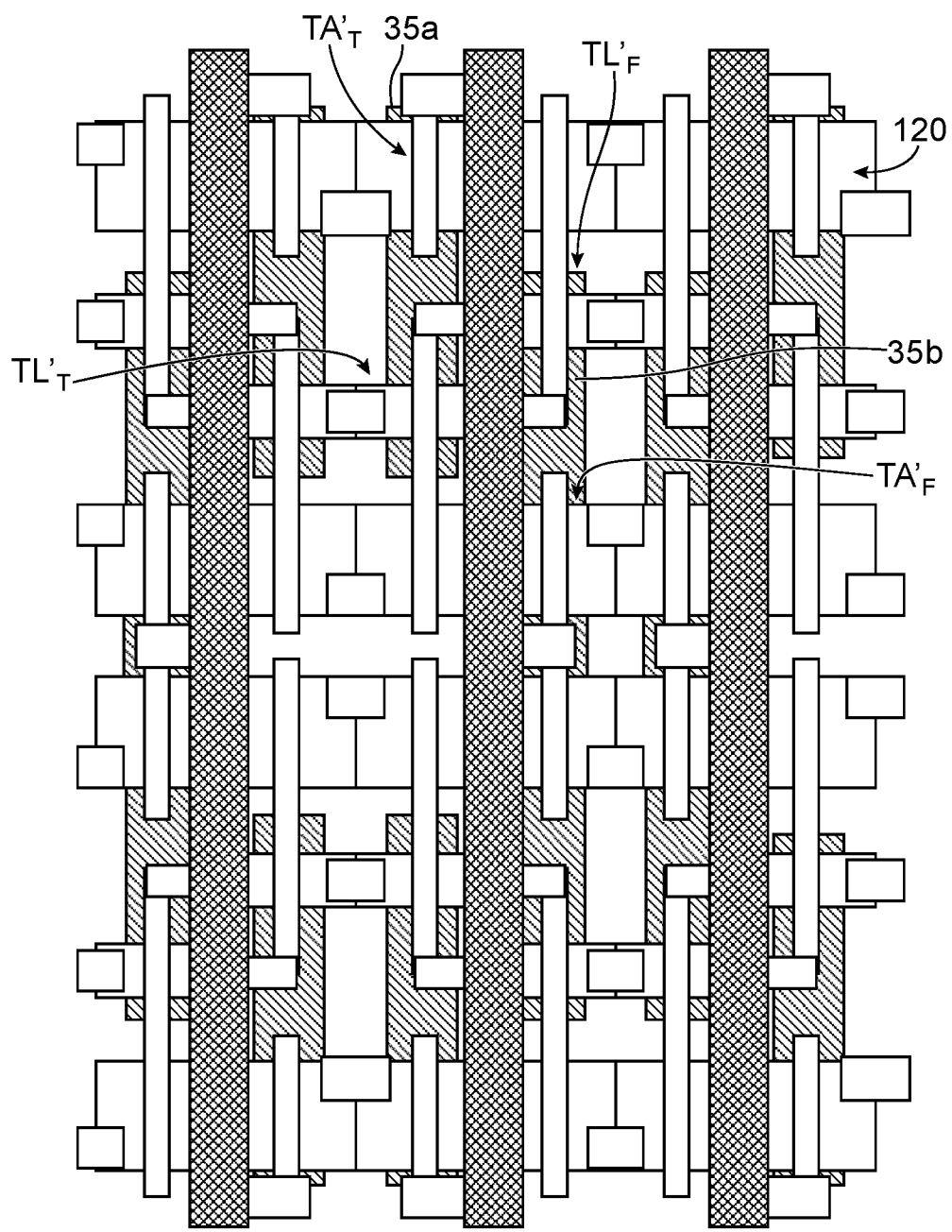

FIG. 5 gives an exemplary layout of the upper level $N_2$ of a 3D circuit provided with SRAM memory cells according to the configuration of FIG. 4 and provided with access transistor $TA'_T$ (respectively $TA'_F$) sharing a common rear gate electrode 35a (resp. 35b) with a load transistor $TL'_T$, (respectively $TL'_F$) according to a configuration of the type of that of FIG. 2B, the lower electrodes 35a, 35b being connected to a write assist line (not shown) located under the semiconductor layer 120 in which extend the channels of transistors of the upper level $N_2$ and which is capable of being divided into distinct active zones or semiconductor islands.

An alternative of SRAM cell in which the access transistors as well as all the transistors forming the inverters are provided with a double gate may also be provided.

Figure 6:
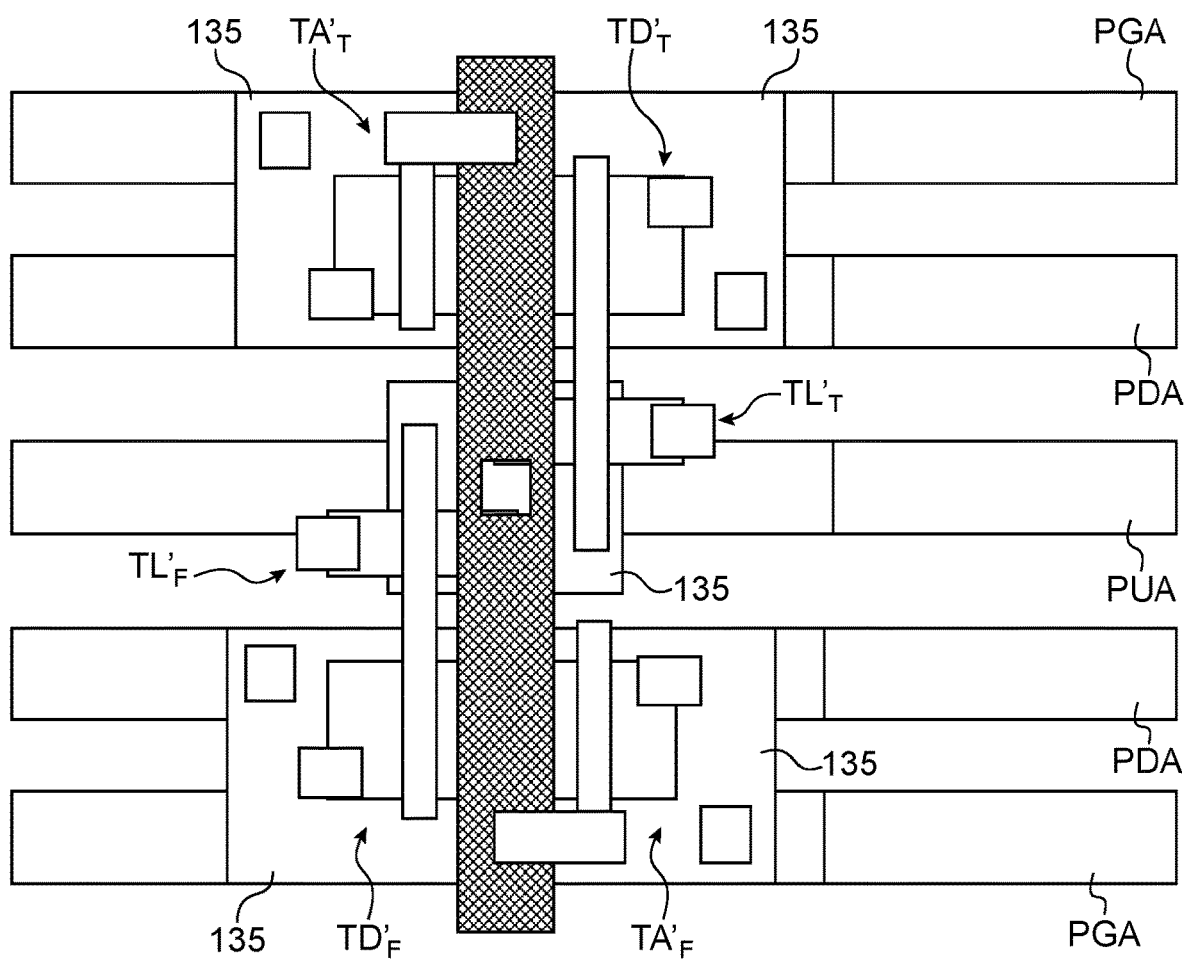

FIG. 6 gives a particular layout of a SRAM cell formed in the upper level $N_2$ of an integrated circuit with load transistors $TL'_T$, $TL'_F$ having a double gate, with a lower gate electrode 135 according to a configuration of the type for example of that of FIG. 2C, that is to say arranged between the second semiconductor layer 120 and the first semiconductor layer 12, and which is common to the load transistors $TL'_T$, $TL'_F$ and connected to a polarisation line PUA located under the lower gate electrode 135 and above the lower level $N_1$.

The load transistors $TD'_T$ and $TD''_F$, and the access transistors $TA'_T$ and $TA'_F$ have a double gate according to a configuration which may be for example of the type of that of FIG. 2C. Each access transistor $TA'_T$ or $TA'_F$ is provided with a rear gate electrode 135 connected to a polarisation line PGA located under the lower gate electrode 135 and above the lower level $N_1$. Each conduction transistor $TD'_T$ or $TD'_F$ is provided with a rear gate electrode 135 connected to a polarisation line PDA located under the lower gate electrode 135 and above the lower level $N_1$.

Each type of transistor, access $TA'_T$, $TA'_F$ or conduction $TD'_T$, $TD'_F$, or load $TL'_T$, $TL'_F$ is controlled through a polarisation line PGA, PDA, PUA that is specific thereto, which makes it possible to carry out an independent control between the different types of transistors of a same cell.

Figure 7:
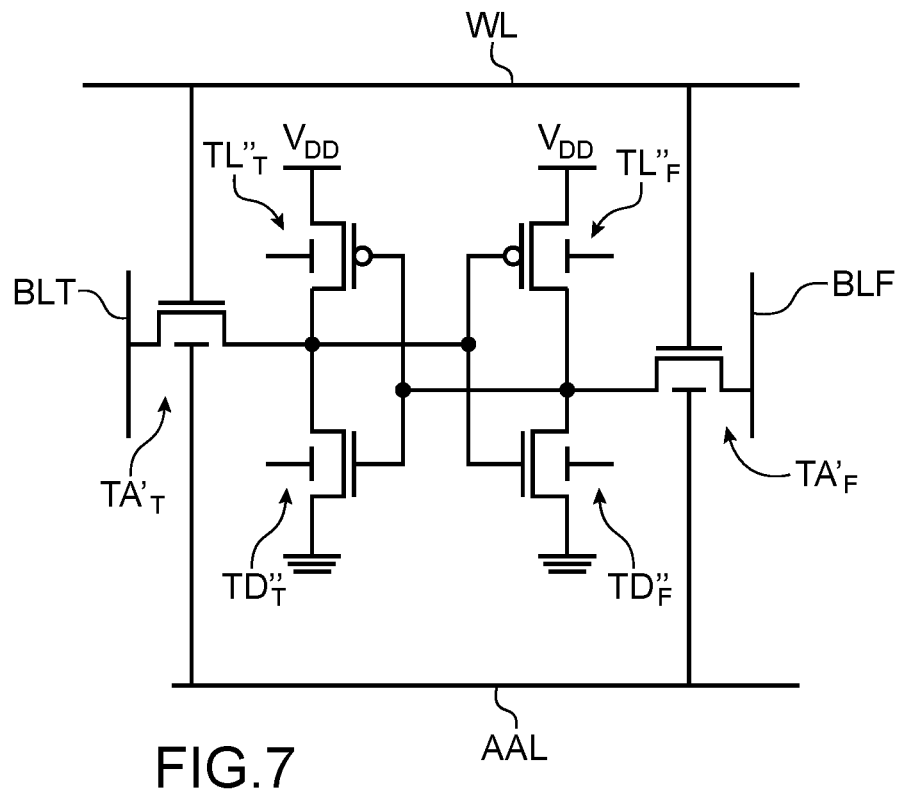

In the exemplary embodiment of FIG. 7, the load transistors TL"$_T$ and TL"$_F$, as well as the conduction transistors TD"$_T$ and TD"$_F$ thus each have an upper gate electrode and a lower gate electrode.

The double gate access transistors TA'$_T$, TA'$_F$ have, in this example, lower gate electrodes connected to each other and to a same so-called "cell access assist" line AAL. The access transistors TA'$_T$, TA'$_F$ may have a layout for example such as illustrated in FIG. 2B or in FIG. 2A.

The access assist line AAL is typically activated during writing and reading operations carried out on the cell. Thus, a given potential for example corresponding to a logic level '1' is applied to this line AAL during writing and reading operations carried out on the cell. When the cell is in retention phase, a different potential, for example corresponding to a logic level '0' is applied to this line AAL. This makes it possible to reduce reading and writing access times while limiting leakage currents.

Figure 8:
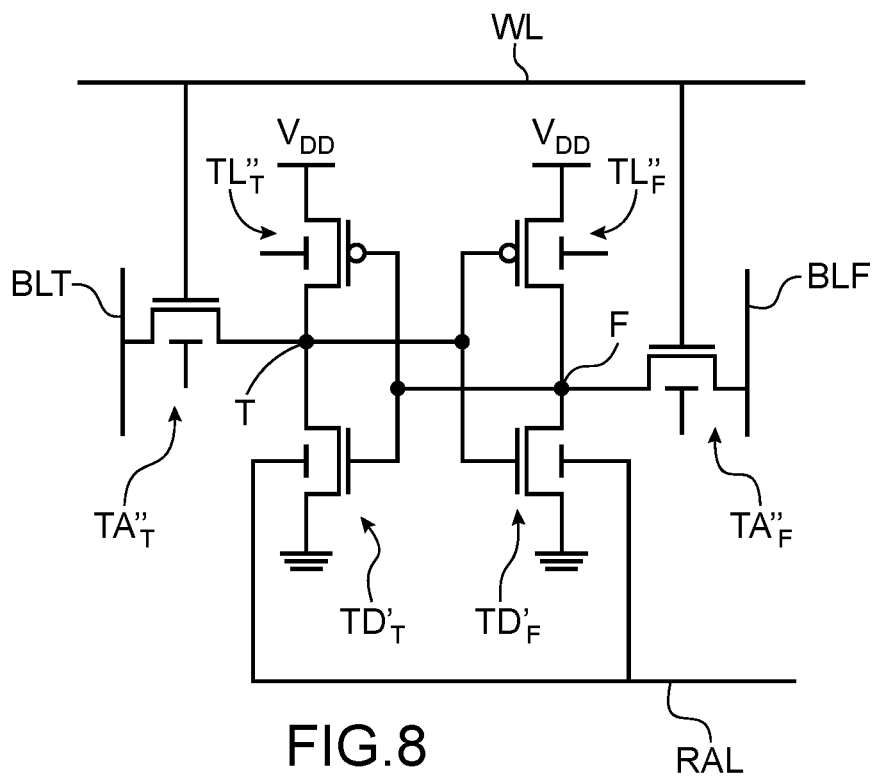

Another alternative of SRAM cell is illustrated in FIG. 8, with access transistors TA"$_T$, TA"$_F$ and load transistors TL"$_T$, TL"$_F$ with double gate, this time conduction transistors TD'$_T$ and TD'$_F$ having gate electrodes connected to each other and to a same so-called "read assist" line RAL. The conduction transistors TD'$_T$ and TD'$_F$ may thus have a layout of the type of that described previously in relation with FIG. 2A or with FIG. 2B, with lower gate electrodes 35 or 35a, 35b connected to each other and to a conductive line 44 or 54, which in this example forms the so-called read assist line RAL.

The read assist line RAL is typically activated during reading operations carried out on the cell. A potential is applied for example corresponding to a logic level '1' on this line RAL during reading operations, whereas when the cell is in retention mode or when a writing is implemented, a different potential, for example corresponding to a logic level '0' is applied to this line RAL. This can make it possible to reduce reading access times and to reduce the static noise margin, while reducing static consumption.

Figure 9:
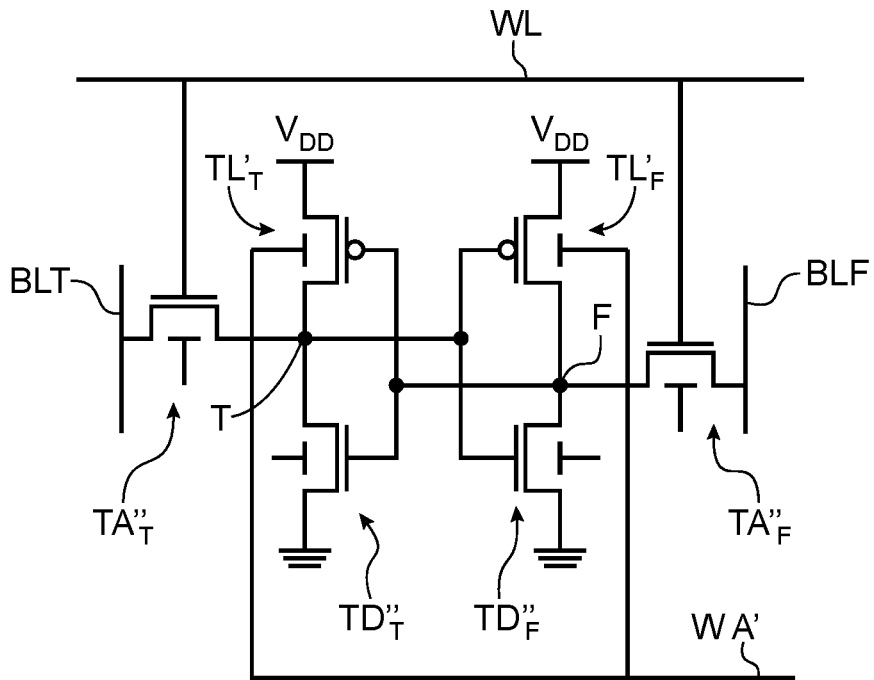

According to another alternative of SRAM cell, illustrated in FIG. 9, access transistors TA"$_T$, TA"$_F$ and conduction transistors TD"$_T$, TD"$_F$ with double gate may be provided, with this time load transistors TL'$_T$ and TL'$_F$ having gate electrodes connected to each other and polarised by means of a same so-called "write assist" line WA'.

To this line WA' is applied a potential corresponding for example to a logic level '1' during writing operations or in retention mode, whereas when a reading operation is carried out on the cell, a different potential, for example corresponding to a logic level '0' is applied to this write assist line WA'. This can make it possible to reduce write access times and the noise margin during writing operations, while reducing the static noise margin.

The load transistors TL'$_T$ and TL'$_F$ may then have a layout of the type of that described previously in relation with FIG. 2A or with FIG. 2B, with lower gate electrodes 35 connected to each other and to a conductive line 44 or 54, which in this example forms the write assist line WA' or is connected to such a write assist line WA'.

Figure 10:
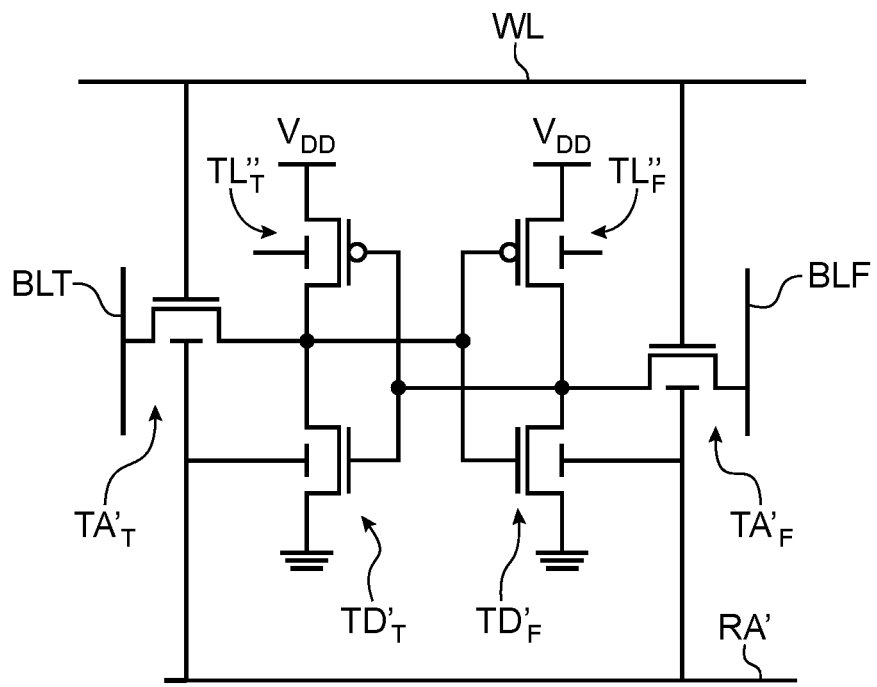

In the exemplary embodiment of FIG. 10, the conduction transistors TD'$_T$ and TD'$_F$ and the access transistors TA'$_T$ and TA'$_F$ each have a double gate structure and are provided with gate electrodes connected to each other and to a same "read assist" line RA'. Typically it is the lower gate electrodes that are connected to each other. The conductive line 44 or 54, such as that illustrated in FIG. 2A or 2B, can fulfil the function of read assist line RA' or be connected to such a read assist line RA'.

It is possible to provide in particular to apply to this line RA' a given potential corresponding for example to a logic level '1' during reading operations, whereas when the cell is in retention mode, a different potential, for example corresponding to a logic level '0' is applied to this read assist line RA'. This makes it possible to reduce read access times as well as leakage currents in retention mode. When such a manner of polarising the line RA' is applied to non-selected cells, in other words cells belonging to a line of cells for which the word line has not been activated or a line of cells for which the access transistors have not been turned on, this makes it possible to improve the Ipg_on/Ipg_off ratio. This ratio may be defined as the ratio between the current in the on-state of the access transistors and the current in the off-state of the access transistors.

Figure 11:
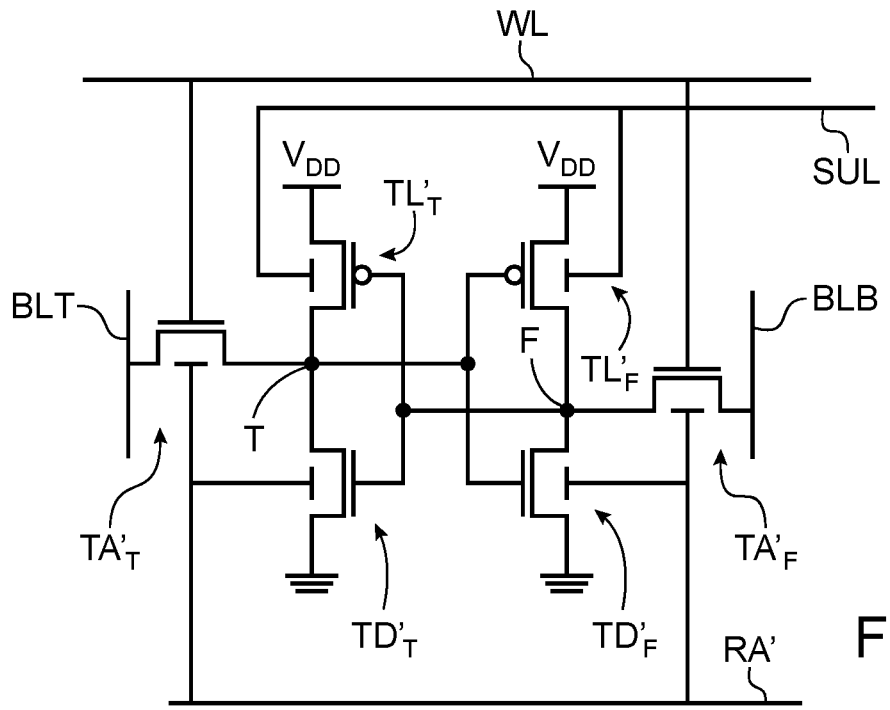

According to an improved alternative of the exemplary embodiment of FIG. 10, it is possible to provide further as in FIG. 11, double gate load transistors TL'$_T$ and TL'$_F$ having this time electrodes, in particular their lower gate electrodes, connected to each other and to a supplementary conductive line SUL.

A polarisation of the lines RA' and SUL such as for example a potential corresponding to logic level '1' is applied to the read assist line RA' and a different potential corresponding to logic level '0' to the supplementary line may be provided. In this case reading operations are improved, in particular in terms of reading time and noise margin.

A reverse polarisation of the lines RA' and SUL such as for example a potential corresponding to logic level '0' is applied to the read assist line RA' and a potential corresponding to logic level '1' to the supplementary line may be provided for the retention phase. This makes it possible to reduce leakage currents during the retention phase. When such a manner of polarising the line RA' is applied to cells not selected, this makes it possible to improve the Ipg_on/Ipg_off ratio.

The lines RA' and SUL may be polarised such that a potential corresponding to logic level '1' is applied to the read assist line RA' and a potential corresponding to logic level '1' to the supplementary line SUL during writing operations. This makes it possible to reduce the writing times and noise margin during writing operations.

Figure 12:
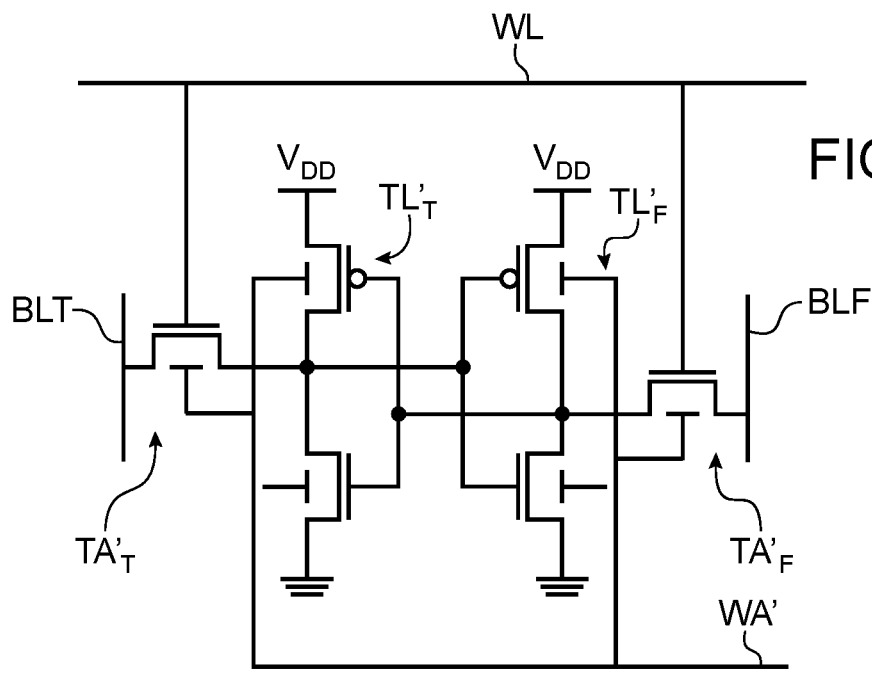

In another example of SRAM cell illustrated in FIG. 12, it is this time the load transistors TL'$_T$ and TL'$_F$ and the access transistors TA$_T$, TA$_F$ that have gate electrodes connected to each other and to a same write assist line WA'.

It is possible to provide in particular to apply to this line WA' a potential corresponding for example to logic level '1' during writing operations, in order to reduce the time necessary for writing and to improve the noise margin during writing operations.

Figure 13:
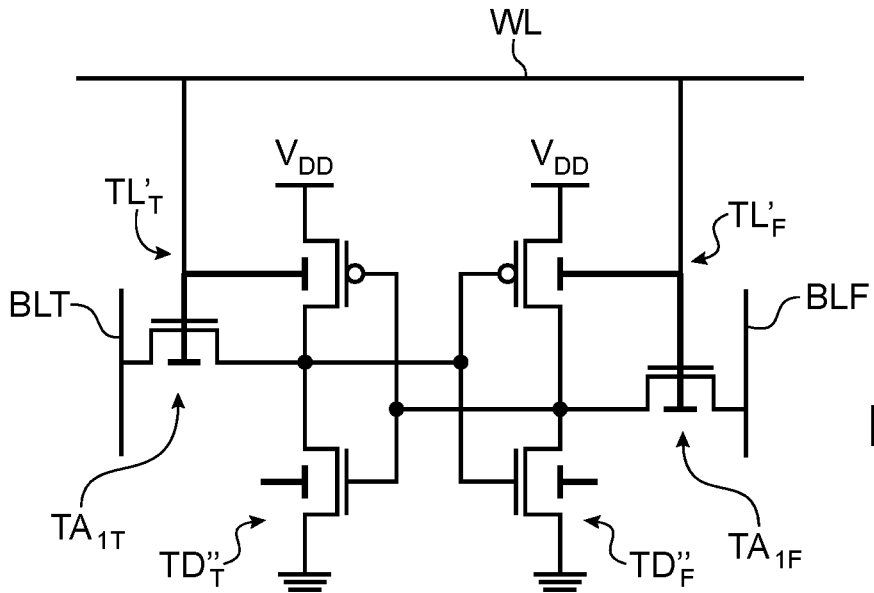

An alternative embodiment illustrated in FIG. 13, provides this time conduction transistors TD"$_T$ and TD"$_F$ with double gate and access transistors TA$_{1T}$ and TA$_{1F}$ also having double gate structures but each further having upper and lower gate electrodes connected to each other and to a word line WL. The load transistors TL'$_T$ and TL'$_F$ also each have a double gate structure with, among their two gate electrodes, a gate electrode connected to the word line WL. Such a layout may, as for the preceding, make it possible to reduce the writing time and to reduce the writing noise margin while having a limited size.

Figure 14:
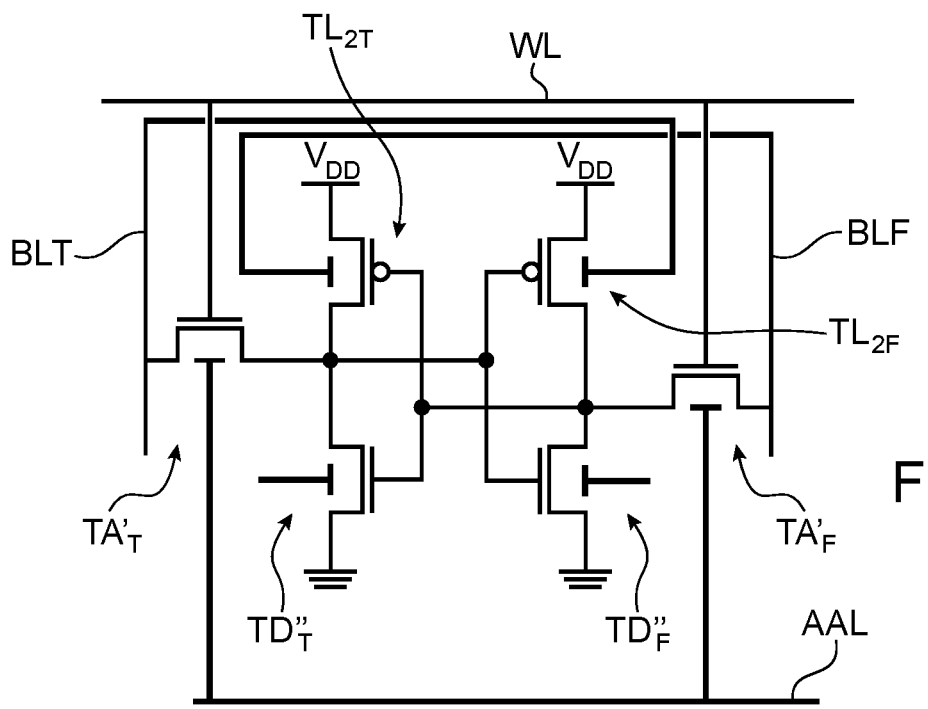

In the exemplary embodiment illustrated in FIG. 14, the access transistors TA'$_T$ and TA'$_F$ and the conduction transistors TD"$_T$ and TD"$_F$ have a layout similar to that in the cell described previously in relation with FIG. 7.

The load transistors $TL_{2T}$ and $TL_{2F}$ have for their part a double gate structure and a particular layout of their supplementary gate electrode. A first load transistor comprises a gate electrode, typically its lower gate electrode, connected to the second bit line BLF.

In so far as the second bit line BLF is typically shared by cells of a same given row of cells, in particular a vertical row or a column, one or more other load transistors belonging respectively to other cells of this same row of cells as that shown may also be provided with a rear gate electrode connected to that of the transistor $TL_{2T}$ according to a configuration of the type of that of FIG. 2B.

A second load transistor comprises a gate electrode, typically its lower gate electrode connected to the first bit line BLT. Similarly, the first bit line BLT being typically shared by other cells of the given row of cells to which the cell shown in FIG. 14 belongs, at least one other load transistor belonging to another cell may also be provided with a rear gate electrode connected to that of the transistor $TL_{2T}$ according to a configuration of the type of that of FIG. 2B.

The access transistors $TA'_T$ and $TA'_F$ have in this example a lower gate electrode connected to an access assist line AAL to which is applied for example a potential corresponding to a logic level '1' during writing and reading operations carried out on the cell. Such a cell may have a reduced reading and writing time as well as a reduced writing noise margin.

During retention phases a different potential, in this example corresponding to a logic level '0' is typically applied to this line AAL. The leakage currents are thereby improved, in particular when the bit lines BLT and BLF are pre-loaded to a logic level '1', corresponding for example to a voltage level equal to VDD.

Figure 15:
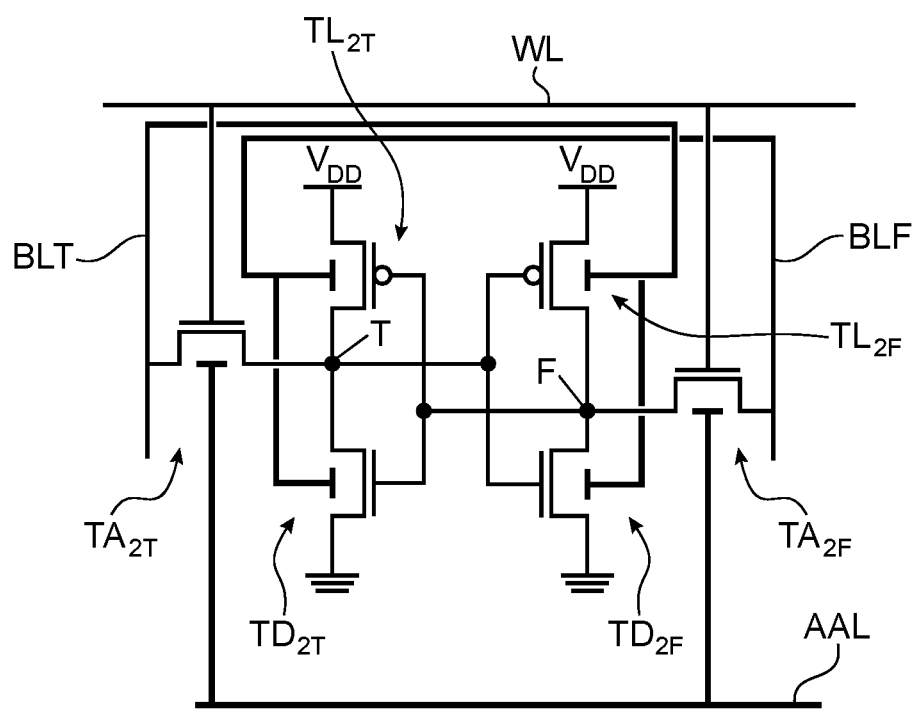

An alternative embodiment of the example described previously is given in FIG. 15.

For this alternative, the conduction transistors $TD_{2T}$ and $TD_{2F}$ have a double gate structure and a particular layout of their supplementary gate electrode, similar to that implemented for the load transistors $TL_{2T}$ and $TL_{2F}$. A first conduction transistor $TD_{2T}$ comprises a gate electrode, typically its lower gate electrode connected to the second bit line BLF, just like the lower gate electrode of the transistor of the first load transistor $TL_{2T}$. A second conduction transistor $TD_{2F}$ comprises a gate electrode, typically its lower gate electrode connected to the first bit line BLT. The lower gate electrode of the second load transistor $TL_{2F}$ is also connected to the first bit line BLT. Such a configuration makes it possible, compared to the preceding configuration, to improve the performances of reading and writing operations.

The invention claimed is:

1. Integrated circuit with SRAM memory and provided with several superimposed levels of components including:
    a lower level provided with one or more electronic components formed in and on at least one first semiconductor layer,
    an upper level, arranged on the lower level, including transistors having respective channel regions formed in at least one second semiconductor layer arranged above the first semiconductor layer, the integrated circuit with SRAM memory including a SRAM memory device formed of a plurality of memory cells, the SRAM memory device including a first transistor and a second transistor belonging to said upper level and each having a double gate composed of an upper electrode formed on the second semiconductor layer and a lower electrode laid out between the second semiconductor layer and the first semiconductor layer, the lower gate electrode of the first transistor being connected to the lower gate electrode of the second transistor, the lower gate electrode of the first transistor and the lower gate electrode of the second transistor being coupled or connected to a conductive polarisation line.

2. Integrated circuit according to claim 1, in which the first transistor and the second transistor belong to a same memory cell of the SRAM memory device or belonging respectively to one cell and to another cell of a same row of memory cells.

3. Integrated circuit according to claim 2, in which the first transistor and the second transistor are conduction or load transistors, respectively of a first memory cell and of a second memory cell of a same row of memory cells, the conductive polarisation line being a first bit line, a second complementary bit line of the first bit line being connected or coupled to a lower gate electrode of another conduction or load transistor of said first cell.

4. Integrated circuit according to claim 1, in which the first transistor and the second transistor have respective lower gate electrodes that are distinct and connected or coupled to said conductive polarisation line through conductive vias.

5. Integrated circuit according to claim 1, in which the first transistor and the second transistor have a common lower gate electrode connected or coupled to the conductive polarisation line arranged above the first and the second transistor by means of at least one conductive via.

6. Integrated circuit according to claim 1, in which the first transistor and the second transistor are access transistors of a same SRAM cell, the upper gate electrode of the first transistor and the upper gate electrode of the second transistor being connected or coupled to a same word line, the conductive polarisation line being a supplementary conductive polarisation line distinct from said word line.

7. Integrated circuit according to claim 6, in which the SRAM cell is further formed of other transistors forming a flip-flop and each having a double gate composed of an electrode laid out on the second semiconductor layer and another electrode laid out between the second semiconductor layer and the first semiconductor layer.

8. Integrated circuit according to claim 6, in which the supplementary conductive polarisation line is a write assist line to which a given potential is applied during writing operations on said SRAM cell and a potential different from said given potential is applied during reading operations carried out on said SRAM cell and retention phases of said SRAM cell.

9. Integrated circuit according to claim 6, in which the supplementary conductive polarisation line is a cell access assist line to which a given potential is applied during writing and reading operations carried out on said SRAM cell and a potential different from said given potential is applied during retention phases of said SRAM cell.

10. Integrated circuit according to claim 6, in which the load transistors have a gate electrode connected or coupled to the supplementary conductive polarisation line.

11. Integrated circuit according to claim 10, in which the supplementary conductive polarisation line is a write assist line to which a given potential is applied during writing operations on said SRAM cell and a potential different from said given potential is applied during reading operations carried out on said SRAM cell or is a write assist line to which a given potential is applied during writing operations on said SRAM cell and a potential different from said given potential is applied during reading operations carried out on said SRAM cell and during retention phases of said SRAM cell.

12. Integrated circuit according to claim 6, in which the conduction transistors have a lower gate electrode connected or coupled to the supplementary conductive polarisation line.

13. Integrated circuit according to claim 12, in which the load transistors have a gate electrode connected or coupled to an additional conductive polarisation line.

14. Integrated circuit according to claim 6, in which the first transistor and the second transistor are respectively a first access transistor connected or coupled to a first storage node of a SRAM cell and a second access transistor connected or coupled to a second storage node of the SRAM cell and in which the SRAM cell is provided with a first load transistor and a second load transistor each having a double gate, the lower gate electrode of the second load transistor being coupled or connected to a first bit line, the lower gate electrode of the first load transistor being coupled or connected to a second bit line.

15. Integrated circuit according to claim 14, in which the SRAM cell is provided with a first conduction transistor and a second conduction transistor each having a double gate, a gate electrode of the second conduction transistor being connected or coupled to the first bit line, a gate electrode of the first conduction transistor being connected or coupled to a second bit line.

16. Integrated circuit according to claim 1, in which the first transistor and the second transistor are access transistors of a SRAM cell and in which the conductive polarisation line is a word line, the upper gate electrode and the lower gate electrode of each of the access transistors being coupled or connected to this word line, said word line being connected or coupled to a gate electrode of a first double gate load transistor of said SRAM cell as well as to a gate electrode of a second double gate load transistor of said SRAM cell.

17. Integrated circuit according to claim 1, in which the first transistor and the second transistor are conduction transistors of a same SRAM cell, the conductive polarisation line being a read assist line to which a given potential is applied during reading operations carried out on said same SRAM cell and a potential different from said given potential during writing operations carried out on said SRAM cell or when the cell is in an information retention phase.

18. Integrated circuit according to claim 1, in which the first transistor and the second transistor are load transistors of a same SRAM cell, the conductive polarisation line being a write assist line to which a given potential is applied during writing operations on said same SRAM cell and retention phase and a potential different from said given potential during reading operations carried out on said SRAM cell.

* * * * *